US008391514B2

(12) United States Patent
Norris

(10) Patent No.: US 8,391,514 B2
(45) Date of Patent: Mar. 5, 2013

(54) PARAMETRIC TRANSDUCER SYSTEMS AND RELATED METHODS

(75) Inventor: Elwood G. Norris, Poway, CA (US)

(73) Assignee: Parametric Sound Corporation, Poway, CA (US)

( * ) Notice: Subject to any disclaimer, the term of this patent is extended or adjusted under 35 U.S.C. 154(b) by 125 days.

(21) Appl. No.: 13/160,065

(22) Filed: Jun. 14, 2011

(65) Prior Publication Data

US 2012/0147707 A1 Jun. 14, 2012

Related U.S. Application Data

(60) Provisional application No. 61/354,533, filed on Jun. 14, 2010, provisional application No. 61/445,195, filed on Feb. 22, 2011.

(51) Int. Cl.
*H04R 3/00* (2006.01)
*H03F 99/00* (2009.01)
*H04B 3/00* (2006.01)

(52) U.S. Cl. .......................... 381/111; 381/120; 381/77

(58) Field of Classification Search .................... 381/77, 381/82, 111, 116, 117, 120, 150; 330/195, 330/196, 197
See application file for complete search history.

(56) References Cited

U.S. PATENT DOCUMENTS 5,361,381 A 11/1994 Short
5,889,870 A 3/1999 Norris
6,229,899 B1 5/2001 Norris et al.
6,411,015 B1 6/2002 Toda
6,556,687 B1 * 4/2003 Manabe ........................ 381/387
6,606,389 B1 8/2003 Selfridge et al.
6,628,791 B1 * 9/2003 Bank et al. .................... 381/113
6,914,991 B1 7/2005 Pompei
7,667,444 B2 2/2010 Mavay et al.
2005/0100181 A1 5/2005 Croft, III et al.
2005/0152561 A1 * 7/2005 Spencer .......................... 381/77
2005/0220311 A1 10/2005 Sun et al.
2006/0215841 A1 9/2006 Vieilledent et al.

OTHER PUBLICATIONS

U.S. Appl. No. 13/160,048, filed Jun. 14, 2011; Elwood G. Norris.
U.S. Appl. No. 13/160,051, filed Jun. 14, 2011; Elwood G. Norris.
PCT Application PCT/US2011/040388; filed Jun. 14, 2011; Elwood G. Norris; International Search Report mailed Dec. 26, 2011.

* cited by examiner

*Primary Examiner* — Tuan D Nguyen
(74) *Attorney, Agent, or Firm* — Thorpe North & Western LLP

(57) ABSTRACT

A method of optimizing a parametric emitter system having a pot core transformer coupled between an amplifier and an emitter, the method comprising: selecting a number of turns required in a primary winding of the pot core transformer to achieve an optimal level of load impedance experienced by the amplifier; and selecting a number of turns required in a secondary winding of the pot core transformer to achieve electrical resonance between the secondary winding and the emitter.

20 Claims, 4 Drawing Sheets

PARAMETRIC TRANSDUCER SYSTEMS AND RELATED METHODS

PRIORITY CLAIM

Priority is claimed of U.S. Provisional Patent Application Ser. No. 61/354,533, filed Jun. 14, 2010, and of U.S. Provisional Patent Application Ser. No. 61/445,195, filed Feb. 22, 2011, each of which is hereby incorporated herein by reference in its entirety.

RELATED CASES

This application is related to U.S. patent application Ser. No. 13/160,048, filed Jun. 14, 2011, titled Improved Parametric Signal Processing Systems and Methods, and is related to U.S. patent application Ser. No. 13/160,051, filed Jun. 14, 2011, titled Improved Parametric Transducers and Related Methods.

BACKGROUND OF THE INVENTION

1. Field of the Invention

The present invention relates generally to the field of parametric loudspeakers and signal processing systems for use in audio production.

2. Related Art

Non-linear transduction, such as a parametric array in air, results from the introduction of sufficiently intense, audio modulated ultrasonic signals into an air column. Self demodulation, or down-conversion, occurs along the air column resulting in the production of an audible acoustic signal. This process occurs because of the known physical principle that when two sound waves with different frequencies are radiated simultaneously in the same medium, a modulated waveform including the sum and difference of the two frequencies is produced by the non-linear (parametric) interaction of the two sound waves. When the two original sound waves are ultrasonic waves and the difference between them is selected to be an audio frequency, an audible sound can be generated by the parametric interaction.

While the theory of non-linear transduction has been addressed in numerous publications, commercial attempts to capitalize on this intriguing phenomenon have largely failed. Most of the basic concepts integral to such technology, while relatively easy to implement and demonstrate in laboratory conditions, do not lend themselves to applications where relatively high volume outputs are necessary. As the technologies characteristic of the prior art have been applied to commercial or industrial applications requiring high volume levels, distortion of the parametrically produced sound output has resulted in inadequate systems.

Whether the emitter is a piezoelectric emitter or PVDF film or electrostatic emitter, in order to achieve volume levels of useful magnitude, conventional systems often required that the emitter be driven at intense levels. These intense levels have often been greater than the physical limitations of the emitter device, resulting in high levels of distortion or high rates of emitter failure, or both, without achieving the magnitude required for many commercial applications.

Efforts to address these problems include such techniques as square rooting the audio signal, utilization of Single Side Band ("SSB") amplitude modulation at low volume levels with a transition to Double Side Band ("DSB") amplitude modulation at higher volumes, recursive error correction techniques, etc. While each of these techniques has proven to have some merit, they have not separately or in combination allowed for the creation of a parametric emitter system with high quality, low distortion and high output volume. The present inventor has found, in fact, that under certain conditions some of the techniques described above actually cause more measured distortion than does a refined system of like components without the presence of these prior art techniques.

SUMMARY OF THE INVENTION

In accordance with one aspect of the invention, a parametric signal emitting system is provided, including a signal processing system that generates an ultrasonic carrier signal having an audio signal modulated thereon. An amplifier can be operable to amplify the carrier signal having the audio signal modulated thereon. An emitter can be capable of emitting into a fluid medium the carrier signal having the audio signal modulated thereon. A transformer can be operatively coupled between the amplifier and the emitter; wherein a secondary winding of the transformer and the emitter are arranged in a parallel resonant circuit.

In accordance with another aspect of the invention, a method of optimizing a parametric emitter system having a pot core transformer coupled between an amplifier and an emitter is provided, the method comprising: determining a number of turns required in a primary winding of the transformer to achieve an optimal level of load impedance experienced by the amplifier; determining an optimal physical size of a pot core to contain the transformer, the pot core having an air gap formed in an inner wall thereof with windings of the transformer circumscribing the inner wall; and selecting a physical size of the air gap of the pot core containing the transformer to enable use of a pot core having the determined optimal physical size while avoiding saturation of the transformer during operation of the parametric emitter system.

In accordance with another aspect of the invention, a method of optimizing performance of an amplifier-emitter pair is provided, including: selecting a pot core to contain and shield a step-up transformer electrically coupled between an amplifier and an emitter, the pot core including an air gap formed in an inner wall thereof; selecting a level of inductance of a secondary winding of the step-up transformer such that electrical resonance can be achieved between the secondary winding and the emitter; and adjusting a size of the air gap of the pot core to decrease an overall physical size of the pot core transformer while avoiding saturation of the transformer during operation of the amplifier-emitter pair.

In accordance with another aspect of the invention, a method of optimizing a parametric emitter system having a pot core transformer coupled between an amplifier and an emitter is provided, the method including: selecting a number of turns required in a primary winding of the pot core transformer to achieve an optimal level of load impedance experienced by the amplifier; and selecting a number of turns required in a secondary winding of the transformer to achieve electrical resonance between the secondary winding and the emitter.

Additional features and advantages of the invention will be apparent from the detailed description which follows, taken in conjunction with the accompanying drawings, which together illustrate, by way of example, features of the invention.

BRIEF DESCRIPTION OF THE DRAWINGS

The following drawings illustrate exemplary embodiments for carrying out the invention. Like reference numerals refer to like parts in different views or embodiments of the present invention in the drawings.

DETAILED DESCRIPTION

Figure 1:
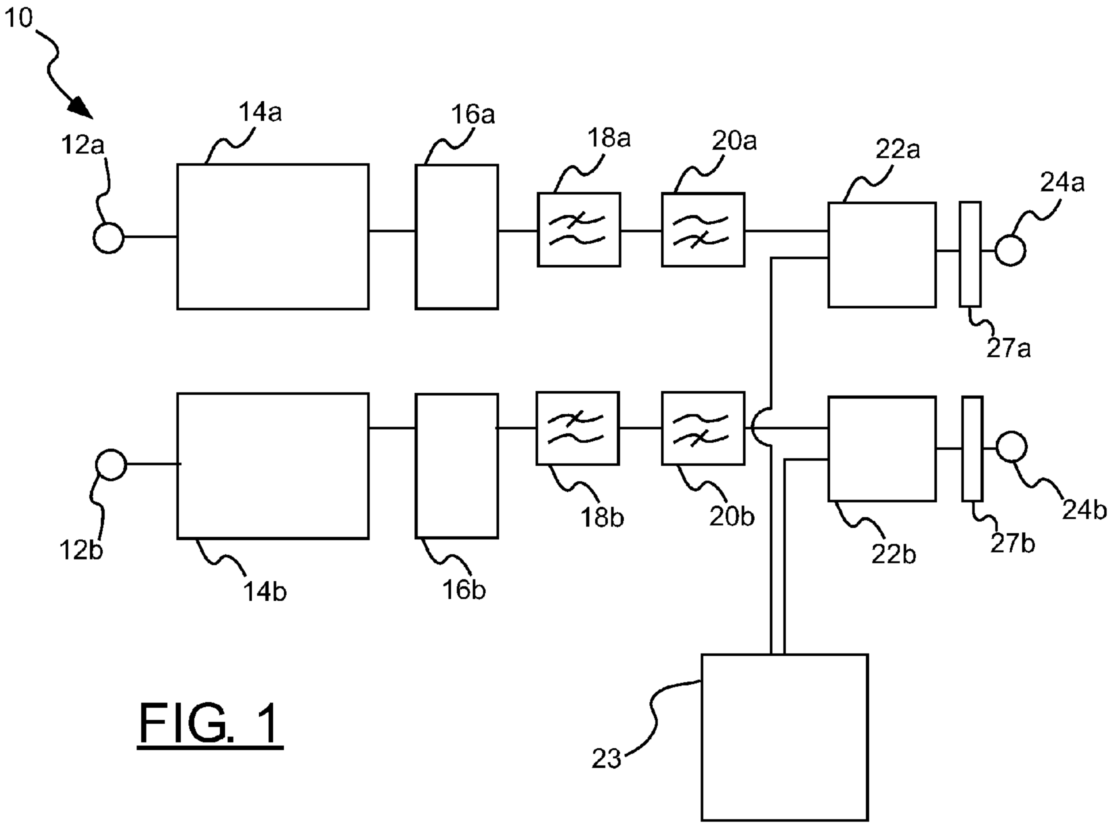
FIG. 1 is a block diagram of an exemplary signal processing system in accordance with one embodiment of the invention.

Reference will now be made to the exemplary embodiments illustrated in the drawings, and specific language will be used herein to describe the same. It will nevertheless be understood that no limitation of the scope of the invention is thereby intended. Alterations and further modifications of the inventive features illustrated herein, and additional applications of the principles of the inventions as illustrated herein, which would occur to one skilled in the relevant art and having possession of this disclosure, are to be considered within the scope of the invention.

DEFINITIONS

As used herein, the singular forms "a" and "the" can include plural referents unless the context clearly dictates otherwise. Thus, for example, reference to "an emitter" can include one or more of such emitters.

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result. In other words, a composition that is "substantially free of" an ingredient or element may still actually contain such item as long as there is no measurable effect thereof.

As used herein, the term "about" is used to provide flexibility to a numerical range endpoint by providing that a given value may be "a little above" or "a little below" the endpoint.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 2, 3, 4, and 5, individually.

This same principle applies to ranges reciting only one numerical value as a minimum or a maximum. Furthermore, such an interpretation should apply regardless of the breadth of the range or the characteristics being described.

As used herein, the term "pot core" is sometimes used to refer to a housing in which a transformer or inductor can be contained. When such a housing is discussed alone, it can be referred to simply as a "pot core." However, when such a housing contains a transformer or inductor, the entire assembly can be referred to as a "pot core transformer" or a "pot core inductor," respectively.

Invention

The present invention relates to improved signal processing systems for use in generating parametric audio signals. The systems described herein have proven to be much more efficient than the systems of the prior art (creating greater output with far lower power consumption), while also providing sound quality which could not be achieved using prior art parametric emitter systems.

One exemplary, non-limiting signal processing system 10 in accordance with the present invention is illustrated schematically in FIG. 1. In this embodiment, various processing circuits or components are illustrated in the order (relative to the processing path of the signal) in which they are arranged according to one implementation of the invention. It is to be understood that the components of the processing circuit can vary, as can the order in which the input signal is processed by each circuit or component. Also, depending upon the embodiment, the processing system 10 can include more or fewer components or circuits than those shown.

Also, the example shown in FIG. 1 is optimized for use in processing multiple input and output channels (e.g., a "stereo" signal), with various components or circuits including substantially matching components for each channel of the signal. It is to be understood that the system can be equally effectively implemented on a single signal channel (e.g., a "mono" signal), in which case a single channel of components or circuits may be used in place of the multiple channels shown.

Referring now to the exemplary embodiment shown in FIG. 1, a multiple channel signal processing system 10 can include audio inputs that can correspond to left 12*a* and right 12*b* channels of an audio input signal. Compressor circuits 14*a*, 14*b* can compress the dynamic range of the incoming signal, effectively raising the amplitude of certain portions of the incoming signals and lowering the amplitude of certain other portions of the incoming signals resulting in a narrower range of audio amplitudes. In one aspect, the compressors lessen the peak-to-peak amplitude of the input signals by a ratio of not less than about 2:1. Adjusting the input signals to a narrower range of amplitude is important to minimize distortion which is characteristic of the limited dynamic range of this class of modulation systems.

Figure 2:
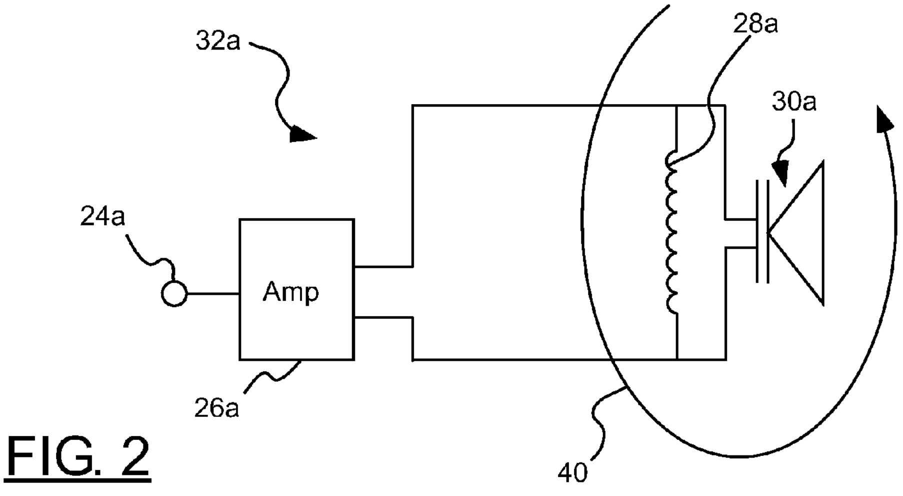
FIG. 2 is a block diagram of an exemplary amplifier and emitter arrangement in accordance with an embodiment of the invention (note that only one amplifier and emitter circuit is shown—in the example of FIG. 1, two such circuits would be used, one output at 24*a* from modulator 22*a* and one output at 24*b* from modulator 22*b*)
Figure 3:
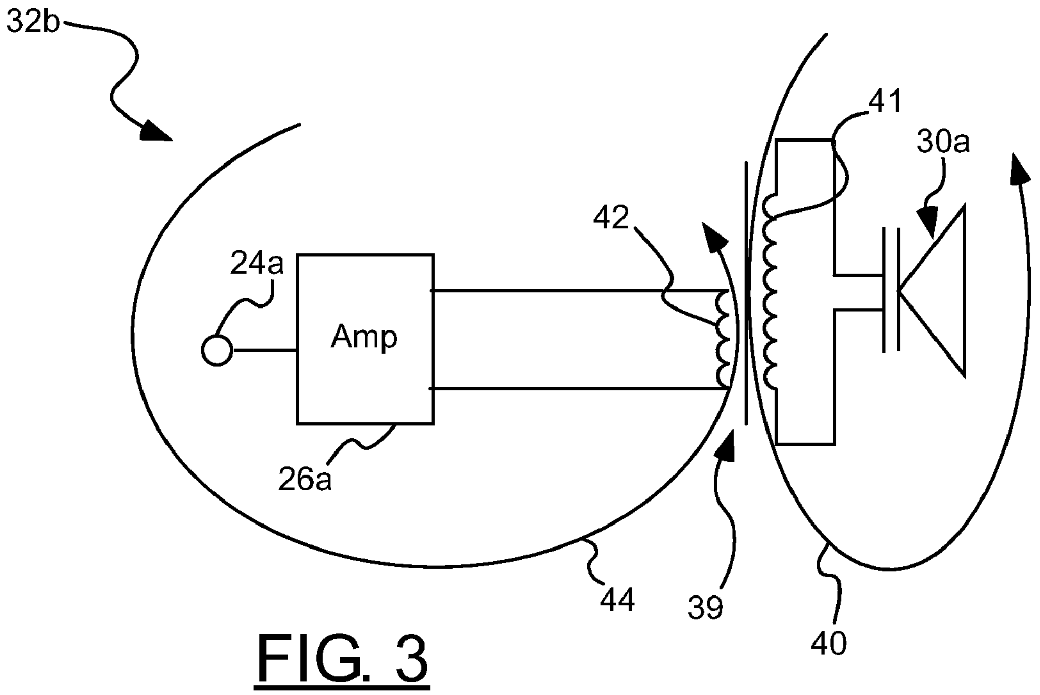
FIG. 3 is a block diagram of an exemplary amplifier and emitter arrangement in accordance with an embodiment of the invention.
Figure 4:
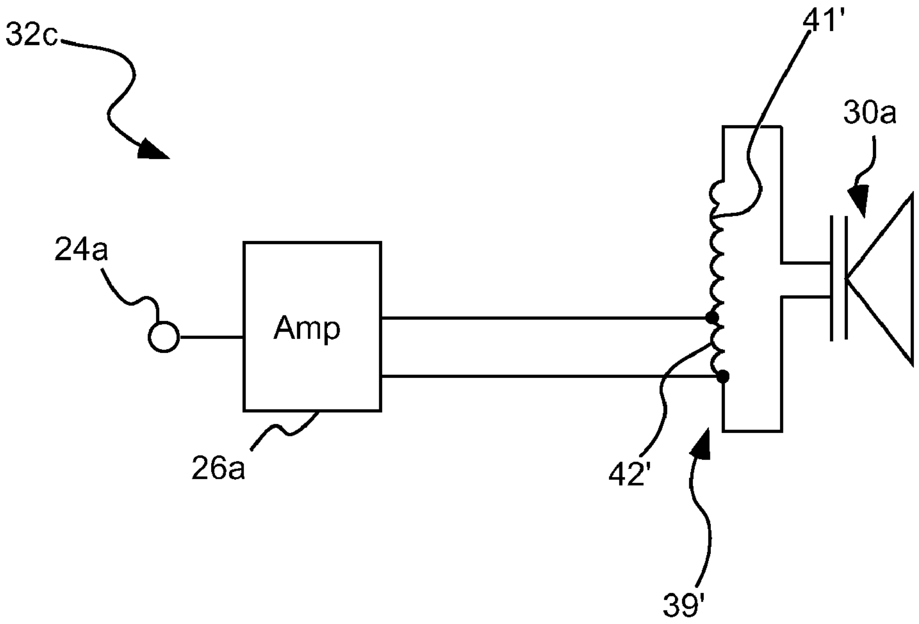
FIG. 4 is a block diagram of an exemplary amplifier and emitter arrangement in accordance with an embodiment of the invention.

After the audio signals are compressed, equalizing networks 16*a*, 16*b* can provide equalization of the signal. The equalization networks can advantageously boost lower frequencies to increase the benefit provided naturally by the emitter/inductor combination of the parametric emitter assembly 32*a*, 32*b*, 32*c* (FIGS. 2, 3 and 4, respectively).

Low pass filter circuits 18*a*, 18*b* can be utilized to provide a hard cutoff of high portions of the signal, with high pass filter circuits 20*a*, 20*b* providing a hard cutoff of low portions of the audio signals. In one exemplarily embodiment of the present invention, low pass filters 18*a*, 18*b* are used to cut signals higher than 15 kHz, and high pass filters 20*a*, 20*b* are used to cut signals lower than 200 Hz (these cutoff points are exemplary and based on a system utilizing an emitter having on the order of 50 square inches of emitter face).

Figure 6:
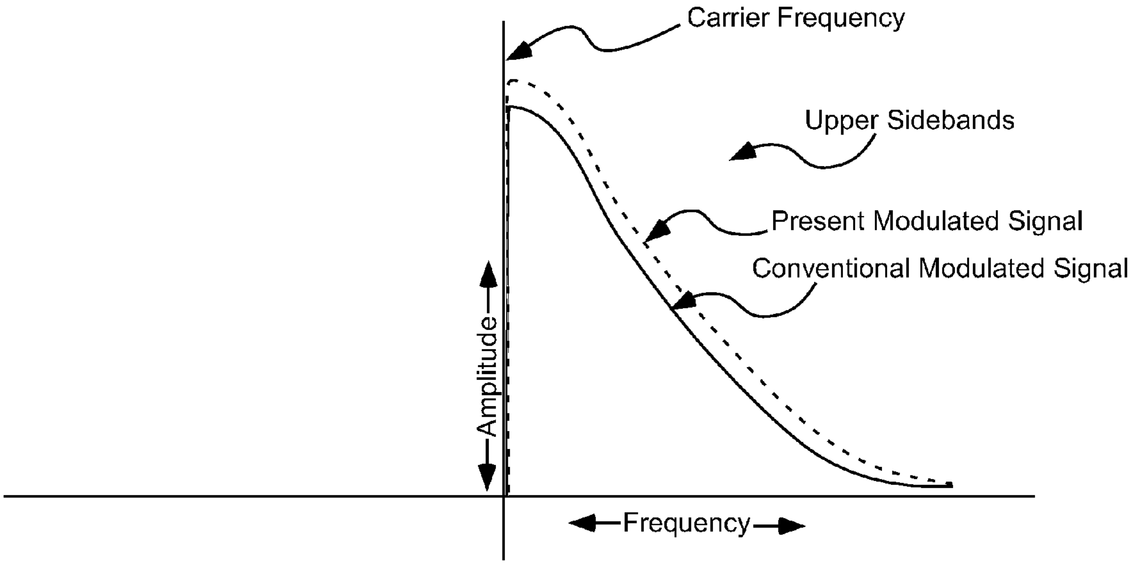
FIG. 6 is a frequency response curve of a signal generated by a conventional signal processing system, shown with an improved frequency response curve (having increased amplitude) of the present invention overlaid thereon.

The high pass filters 20*a*, 20*b* can advantageously cut low frequencies that, after modulation, result in nominal deviation of carrier frequency (e.g., those portions of the modulated signal of FIG. 6 that are closest to the carrier frequency). These low frequencies are very difficult for the system to reproduce efficiently (as a result, much energy can be wasted trying to reproduce these frequencies), and attempting to reproduce them can greatly stress the emitter film (as they would otherwise generate the most intense movement of the emitter film).

The low pass filter can advantageously cut higher frequencies that, after modulation, could result in the creation of an audible beat signal with the carrier. By way of example, if a low pass filter cuts frequencies above 15 kHz, with a carrier frequency of around 44 kHz, the difference signal will not be lower than around 29 kHz, which is still outside of the audible range for humans. However, if frequencies as high as 25 kHz were allowed to pass the filter circuit, the difference signal generated could be in the range of 19 kHz, which is well within the range of human hearing.

In the exemplary embodiment shown, after passing through the low pass and high pass filters, the audio signals are modulated by modulators 22*a* and 22*b*, where they are combined with a carrier signal generated by oscillator 23. While not so required, in one aspect of the invention, a single oscillator (which in one embodiment is driven at a selected frequency of 40 kHz to 50 kHz, which range corresponds to readily available crystals that can be used in the oscillator) is used to drive both modulators 22*a*, 22*b*. By utilizing a single oscillator for multiple modulators, an identical carrier frequency is provided to multiple channels being output at 24*a*, 24*b* from the modulators. This aspect of the invention can negate the generation of any audible beat frequencies that might otherwise appear between the channels while at the same time reducing overall component count.

While not so required, in one aspect of the invention, high-pass filters 27*a*, 27*b* can be included after modulation that serve to filter out signals below about 25 kHz. In this manner, the system can ensure that no audio frequencies enter the amplifier via outputs 24*a*, 24*b*: only the modulated carrier wave is fed to the amplifier(s), with any audio artifacts being removed prior to the signal being fed to the amplifier(s).

In summary, the signal processing system 10 receives audio input at 12*a*, 12*b* and processes these signals prior to feeding them to modulators 22*a*, 22*b*. An oscillating signal is provided at 23, with the resultant outputs at 24*a*, 24*b* then including both a carrier (typically ultrasonic) wave and the audio signals that are being reproduced, typically modulated onto the carrier wave. The resulting signal(s), once emitted in a non-linear medium such as air, produce highly directional parametric sound within the non-linear medium.

For more background on the basic technology behind the creation of an audible wave via the emission of two ultrasonic waves, the reader is directed to numerous patents previously issued to the present inventor, including U.S. Pat. Nos. 5,889,870 and 6,229,899, which are incorporated herein by reference to the extent that they are consistent with the teachings herein. Due to numerous subsequent developments made by the present inventor, these earlier works are to be construed as subordinate to the present disclosure in the case any discrepancies arise therebetween.

Turning now to FIG. 2, one exemplary amplifier/emitter configuration is shown in accordance with one aspect of the invention. Note, for ease of description, only one amplifier/emitter configuration is shown, coupled to output 24*a* from FIG. 1. Typically, the circuit from FIG. 1 would feed two such amplifier/emitter sets, fed from outputs 24*a* and 24*b* (in which case, due to the common oscillator 23, the same carrier signal could be applied to both sets of amplifiers/emitters).

Typically, the signal from the signal processing system 10 is electronically coupled to amplifier 26*a*. After amplification, the signal is delivered to emitter assembly 32*a*. In the embodiment shown, the emitter assembly includes an emitter 30*a* that can be operable at ultrasonic levels. An inductor 28*a* forms a parallel resonant circuit with the emitter 30*a*. By configuring the inductor in parallel with the emitter, the current circulates through the inductor and emitter (as represented schematically by loop 40) and a parallel resonant circuit can be achieved.

Many conventional systems utilize an inductor oriented in series with the emitter. The disadvantage to this arrangement is that such a resonant circuit must necessarily cause wasted current to flow through the inductor. As is known in the art, the emitter 30*a* will perform best at (or near) the point where electrical resonance is achieved in the circuit. However, the amplifier 26*a* introduces changes in the circuit, which can vary by temperature, signal variance, system performance, etc. Thus, it can be more difficult to obtain (and maintain) stable resonance in the circuit when the inductor 28*a* is oriented in series with the emitter (and the amplifier).

The embodiment of the invention illustrated in FIG. 2 allows resonance to be achieved in the inductor-emitter circuit without the direct presence of the amplifier in the circulating current path (e.g., loop 40), resulting in more stable and predictable performance of the emitter, and significantly less power being wasted as compared to conventional series resonant circuits. Obtaining resonance at optimal system performance can greatly improve the efficiency of the system (that is, reduce the power consumed by the system) and greatly reduce the heat produced by the system.

The inductor 28*a* can be of a variety of types known to those of ordinary skill in the art. However, inductors generate a magnetic field that can "leak" beyond the confines of the inductor. This field can interfere with the operation and/or response of the parametric emitter. Also, many inductor/emitter pairs used in parametric sound applications operate at voltages that generate a great deal of thermal energy. Heat can also negatively affect the performance of a parametric emitter.

For at least these reasons, in most conventional parametric sound systems the inductor is physically located a considerable distance from the emitter. While this solution addresses the issues outlined above, it adds another significant complication: the signal carried from the inductor to the emitter is generally a relatively high voltage (on the order of 160 V peak-to-peak or higher). As such, the wiring connecting the inductor to the emitter must be rated for high voltage applications. Also, long “runs” of the wiring may be necessary in certain installations, which can be both expensive and dangerous, and can also interfere with communication systems not related to the parametric emitter system.

Figure 5:
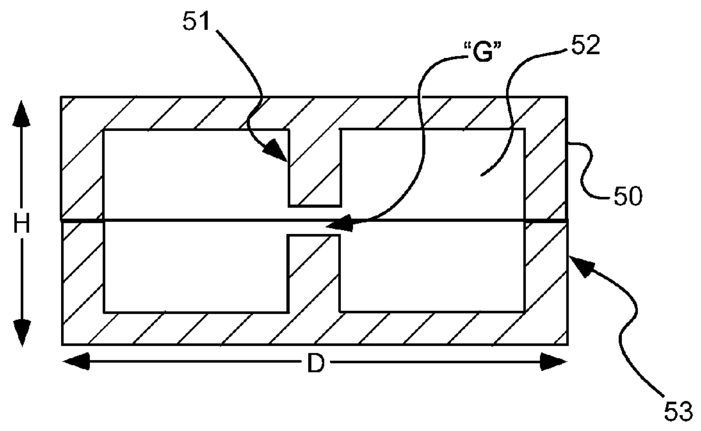
FIG. 5 is a sectional view of a pot core used in an inductor/transformer assembly in accordance with an embodiment of the invention.

The present inventor has addressed this problem in a number of manners. In one aspect of the invention, the inductor 28*a* (and, as a component 41, 41' of a transformer 39, 39' shown in FIGS. 3 and 4) is a “pot core” inductor that is held within a pot core 50 (FIG. 5), typically formed of a ferrite material. The pot core serves to confine the inductor windings and the magnetic field generated by the inductor. The pot core illustrated at 50 in FIG. 5 is shown for exemplary purposes only. Such a pot core will typically include an outer wall 53 and an inner wall 51. The outer wall substantially completely encloses the windings of the transformer within the pot core, while the windings of the transformer circumscribe the inner wall.

Typically, the pot core 50 includes two ferrite halves that define a cavity 52 within which coils of the inductor can be disposed (the windings of the inductor are generally wound upon a bobbin or similar structure prior to being disposed within the cavity). An air gap “G” can serve to dramatically increase the permeability of the pot core without affecting the shielding capability of the core (the inductor(s) within the pot core are substantially completely shielded). Thus, by increasing the size of the air gap “G,” the permeability of the pot core is increased. However, increasing the air gap also causes an increase in the number of turns required in the inductor(s) held within the pot core in order to achieve a desired amount of inductance.

Thus, a large air gap can dramatically increase permeability and at the same time reduce heat generated by an inductor held within the pot core, without compromising the shielding properties of the core. However, by increasing the size of the air gap, more windings are required on the inductor (28*a*, 41, 41') to achieve the inductance required to match the emitter 30*a* (e.g., to create a resonant circuit with the emitter). As discussed further below, the present inventor capitalizes on this seeming disadvantage to increasing the size of the air gap “G”.

Another obstacle faced by many conventional approaches to parametric sound production lies in a problem related to the relationship between the amplifier and the emitter. Generally speaking, the higher a frequency that is processed by an amplifier, the higher impedance at which the amplifier is best suited to operate (in the present case, the impedance experienced by the amplifier is the result of the load introduced by the inductor/emitter pair, and by the overall amplifier/inductor/emitter circuit). In the case of parametric sound production, the operative signal is generally 40 kHz (or above). Amplifiers working with frequencies as high as this work best when experiencing relatively high load impedances (on the order of 8-12 Ohms). However, conventional parametric circuitry often present loads to the amplifier having impedances as low as 3 Ohms or less. Impedances this low are deemed too low even for conventional audio amplifiers to perform optimally.

To account for this, it would be desirable to increase the impedance of the inductor/emitter circuit to improve the performance of the amplifier. However, as the available designs for parametric emitters are limited, and as it is optimal to obtain resonance in the inductor/emitter pairing, merely increasing (or decreasing) the load applied by the inductor/emitter to the amplifier is not easily accomplished without adversely affecting performance of the unit as a whole.

When faced with these considerations, the present inventor was led to develop a novel manner of simultaneously addressing a multitude of problems. In the embodiment illustrated in FIG. 3, a step-up transformer 39 includes a pair of inductor elements 41 and 42. In this arrangement, inductor element 41 serves as the secondary winding, and inductor element 42 serves as the primary winding. In one embodiment, both the primary and secondary windings are contained within the pot core 50 illustrated in FIG. 5. The combination of these elements allows the design of a highly efficient emitter system that can be optimized to a number of performance characteristics.

As discussed above, it is desirable to achieve a parallel resonant circuit (loop 40 of FIG. 3) with the inductor element 41 and the emitter 30*a*. However, it is also desirable to increase the impedance load experienced by the amplifier 26*a* due to the load of the inductor/emitter pair (and the overall assembly 32*a*, 32*b*, 32*c*, etc.) to provide an impedance load at which the amplifier is more suited to operate. It is also desirable to achieve each of these objectives while locating the inductor physically near the emitter without radiation and heat generated by the inductor interfering with the emitter. The present system addresses each of these issues as follows:

By adjusting the air gap “G” of the pot core that contains inductor elements 41 and 42, the number of turns necessary in the inductor element 41 can be adjusted (a larger air gap “G” requires more turns on the inductor element 41 to maintain the same level of inductance as a smaller air gap “G”). Inductor element 41 is the secondary winding of the step-up transformer 39. By increasing the number of turns on inductor element 41, the number of turns on inductor element 42 must also be increased (to maintain the same ratio in the step-up transformer). Advantageously, by increasing the number of turns on inductor element 42, the impedance load “seen” or experienced by the amplifier 26*a* is increased. This increased impedance results in the amplifier 26*a* performing much better than at low impedances.

Thus, each of loop 40 and loop 44 (FIG. 3) can be “tuned” to operate at its most efficient level. Adjusting the air gap “G” in the pot core provides the ability to adjust the number of turns in inductor element 41 without changing the desired inductance of inductor element 41 (which would otherwise affect the resonance in loop 40). This, in turn, provides the ability to adjust the number of turns in inductor element 42 to best match the impedance load at which the amplifier performs best. Thus, the present inventor has found a manner of essentially de-coupling (from either or both a physical and a design standpoint) the various adjustments that are possible in the circuit to allow refinements that positively affect the circuit of loop 44 without negatively affecting the circuit of loop 40. This has been accomplished by recognizing that the air gap “G” can be adjusted to maintain the same level of inductance in inductor element 41 while allowing adjustment to the number of turns in inductor element 41.

Another advantage provided by the present system is that the physical size of the pot core 50 can be minimized a great deal by simply increasing the air gap size “G” as the overall physical size of the pot core 50 is decreased. In this manner, a very small pot core transformer can be utilized while still providing the desired inductance in element 41, 41' to create resonance with the emitter 30*a*, and the desired inductance in element 42, 42' to provide a suitable impedance load at which the amplifier 26*a* operates best. This can be accomplished while still preventing saturation of the transformer, which might otherwise occur should a smaller transformer be utilized.

The concept can be carried out in a number of manners. In the example shown in FIG. 3, two inductor elements 41, 42 are utilized, the windings of which are encompassed within the pot core 50. In the example illustrated in FIG. 4, the primary and secondary windings can be combined in what is commonly referred to as an autotransformer 39', the operation and function of which will be readily appreciated by one of ordinary skill in the art having possession of this disclosure. The autotransformer can be configured such that its windings can easily be contained within the pot core.

The use of a step-up transformer provides additional advantages to the present system. Because the transformer "steps-up" from the direction of the amplifier to the emitter, it necessarily "steps-down" from the direction of the emitter to the amplifier. Thus, any negative feedback that might otherwise travel from the inductor/emitter pair to the amplifier is reduced by the step-down process, thus minimizing the affect of any such event on the amplifier and the system in general (in particular, changes in the inductor/emitter pair that might affect the impedance load experienced by the amplifier are greatly minimized).

In one exemplary embodiment, 175/64 Litz wire is used for the primary and secondary windings. Inductor element 41 can include about 25 turns and inductor element 42 can include about 4.5 turns. Air gap "G" is established at about 2 mm (using a ferrite pot core with a diameter "D" of about 36 mm and a height "H" of about 22 mm). In this aspect, the amplifier experiences an impedance of about 8 Ohms (measured at an operating frequency of about 44 kHz).

The above-described system performs with markedly low heat production (e.g., markedly high efficiency). In one test scenario, the system was run continuously for seven days, twenty-fours a day, at maximum output, with 90% modulation. After (and during) this test, the measured temperature of the system barely, if at all, deviated from room temperature.

Figure 7:
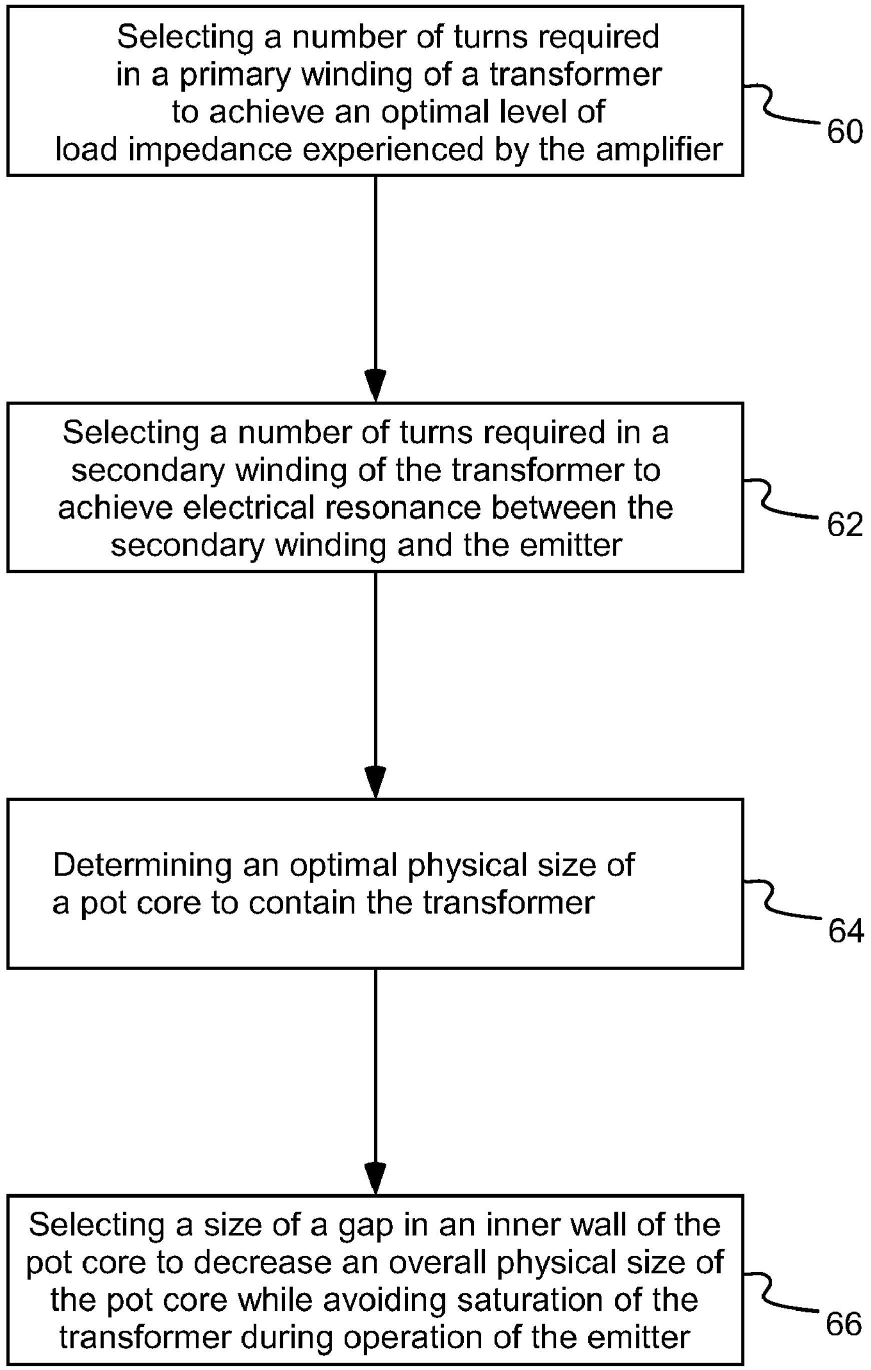
FIG. 7 includes a flowchart illustrating a method of optimizing a parametric emitter system having a pot core transformer coupled between an amplifier and an emitter in accordance with one embodiment of the invention.

The flowchart of FIG. 7 illustrates one exemplary method of the present invention. In this process, a method of optimizing a parametric emitter system having a pot core transformer coupled between an amplifier and an emitter is provided. The method can include, at 60, selecting a number of turns required in a primary winding of the pot core transformer to achieve an optimal level of load impedance experienced by the amplifier. At 62, a number of turns required in a secondary winding of the transformer can be selected in order to achieve electrical resonance between the secondary winding and the emitter. At 64, an optimal physical size of a pot core to contain the transformer can be determined, with the pot core having an air gap formed in an inner wall thereof with windings of the transformer circumscribing the inner wall. At 66, a size of the air gap of the pot core containing the windings of the transformer can be selected to decrease an overall physical size of the pot core transformer while avoiding saturation of the transformer during operation of the emitter.

In the foregoing specification, the invention has been described with reference to specific exemplary embodiments thereof. It will, however, be evident that various modifications and alternative arrangements can be made thereto without departing from the broader spirit and scope of the present invention as set forth in the appended claims. The specification and drawings are, accordingly, to be regarded in an illustrative rather than a restrictive sense.

I claim:

1. A parametric signal emitting system, comprising:

a signal processing system that generates an ultrasonic carrier signal having an audio signal modulated thereon;

an amplifier, operable to amplify the carrier signal having the audio signal modulated thereon;

an emitter, capable of emitting into a fluid medium the carrier signal having the audio signal modulated thereon; and a pot core transformer, operatively coupled between the amplifier and the emitter; wherein a secondary winding of the pot core transformer and the emitter are arranged in a parallel resonant circuit.

2. The system of claim 1, wherein the pot core includes an outer wall that substantially fully encloses windings of the transformer, and an inner wall circumscribed by the windings of the transformer.

3. The system of claim 2, wherein the inner wall includes an air gap defined therein.

4. The system of claim 1, wherein a number of turns in a secondary winding of the pot core transformer is selected to produce electrical resonance with a capacitance of the emitter.

5. The system of claim 1, wherein a number of turns in a primary winding of the pot core transformer is selected to achieve an optimal level of load impedance experienced by the amplifier.

6. The system of claim 1, wherein the transformer comprises an autotransformer.

7. The system of claim 1, wherein the transformer is attached to an assembly carrying the emitter.

8. A method of optimizing a parametric emitter system having a pot core transformer coupled between an amplifier and an emitter, the method comprising:

determining a number of turns required in a primary winding of the pot core transformer to achieve an optimal level of load impedance experienced by the amplifier;

determining an optimal physical size of a pot core to contain windings of the transformer, the pot core having an air gap formed in an inner wall thereof with the windings of the transformer circumscribing the inner wall; and selecting a size of the air gap of the pot core containing the transformer windings to enable use of a pot core having the determined optimal physical size while avoiding saturation of the transformer during operation of the parametric emitter system.

9. The method of claim 8, wherein the pot core transformer comprises an autotransformer.

10. The method of claim 8, wherein an induction of a secondary winding of the transformer electrically resonates with a capacitance of the emitter.

11. A method of optimizing performance of an amplifier-emitter pair, comprising:

selecting a pot core to contain and shield a step-up transformer electrically coupled between an amplifier and an emitter, the pot core including an air gap formed in an inner wall thereof;

selecting a level of inductance of a secondary winding of the step-up transformer such that electrical resonance can be achieved between the secondary winding and the emitter; and adjusting a size of the air gap of the pot core to decrease an overall physical size of the pot core transformer while avoiding saturation of the transformer during operation of the amplifier-emitter pair.

12. The method of claim 11, further comprising:

selecting a desired number of turns on a primary winding of the step-up transformer such that an optimal level of load impedance is presented to the amplifier electrically coupled to the primary winding.

13. The method of claim 11, wherein the step-up transformer comprises an autotransformer.

14. A method of optimizing a parametric emitter system having a pot core transformer coupled between an amplifier and an emitter, the method comprising:

selecting a number of turns required in a primary winding of the pot core transformer to achieve an optimal level of load impedance experienced by the amplifier; and selecting a number of turns required in a secondary winding of the pot core transformer to achieve electrical resonance between the secondary winding and the emitter.

15. The method of claim 14, further comprising:

determining an optimal physical size of a pot core to contain the transformer, the pot core having an air gap formed in an inner wall thereof with windings of the transformer circumscribing the inner wall; and selecting a size of the air gap of the pot core containing the transformer to decrease an overall physical size of the pot core transformer while avoiding saturation of the transformer during operation of the emitter.

16. The method of claim 15, wherein the pot core containing the windings of the transformer is substantially toroidal in configuration.

17. The method of claim 16, wherein the toroidal pot core includes an outer wall that substantially fully encloses the windings of the transformer, and an inner wall circumscribed by the windings of the transformer.

18. The method of claim 17, wherein the inner wall includes the air gap defined therein.

19. The method of claim 14, wherein the amplifier provides a modulated ultrasonic signal to the emitter.

20. The method of claim 19, wherein the emitter is optimized to emit the modulated ultrasonic signal into a nonlinear medium adjacent the emitter.

* * * * *